United States Patent
Chen et al.

(10) Patent No.: US 8,584,056 B2
(45) Date of Patent: Nov. 12, 2013

(54) FAST FREEFORM SOURCE AND MASK CO-OPTIMIZATION METHOD

(75) Inventors: Luoqi Chen, Saratoga, CA (US); Jun Ye, Palo Alto, CA (US); Yu Cao, Saratoga, CA (US)

(73) Assignee: ASML Netherlands B.V., Veldhoven (NL)

( * ) Notice: Subject to any disclaimer, the term of this patent is extended or adjusted under 35 U.S.C. 154(b) by 68 days.

(21) Appl. No.: 13/130,548

(22) PCT Filed: Nov. 20, 2009

(86) PCT No.: PCT/US2009/065359
§ 371 (c)(1),
(2), (4) Date: May 20, 2011

(87) PCT Pub. No.: WO2010/059954
PCT Pub. Date: May 27, 2010

(65) Prior Publication Data
US 2011/0230999 A1 Sep. 22, 2011

Related U.S. Application Data (60) Provisional application No. 61/116,788, filed on Nov. 21, 2008.

(51) Int. Cl.
*G06F 17/50* (2006.01)
(52) U.S. Cl.
USPC .......................................................... 716/53
(58) Field of Classification Search
USPC ..................................................... 716/50–56
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 5,882,258 A * | 3/1999 | Kelly et al. | 463/11 |
| 5,969,441 A | 10/1999 | Loopstra et al. | |
| 6,046,792 A | 4/2000 | Van Der Werf et al. | |

(Continued)

FOREIGN PATENT DOCUMENTS

| | | |
|---|---|---|
| JP | 2002-261004 | 9/2002 |
| JP | 2004-312027 | 11/2004 |

(Continued)

OTHER PUBLICATIONS

Fuhner, Tim, et al., "Simulation Based EUV source and Mask Optimization", Oct. 17, 2008, Proc. SPIE 7122, Photomask Technology 2008, 71221Y. pp. 1-14.*

(Continued)

*Primary Examiner* — Stacy Whitmore
(74) *Attorney, Agent, or Firm* — Pillsbury Winthrop Shaw Pittman LLP (57) ABSTRACT

The present invention relates to lithographic apparatuses and processes, and more particularly to tools for optimizing illumination sources and masks for use in lithographic apparatuses and processes. According to certain aspects, the present invention significantly speeds up the convergence of the optimization by allowing direct computation of gradient of the cost function. According to other aspects, the present invention allows for simultaneous optimization of both source and mask, thereby significantly speeding the overall convergence. According to still further aspects, the present invention allows for free-form optimization, without the constraints required by conventional optimization techniques.

15 Claims, 8 Drawing Sheets

(56) References Cited

U.S. PATENT DOCUMENTS

| | | | |
|---|---|---|---|
| 7,003,758 | B2 | 2/2006 | Ye et al. |
| 7,587,704 | B2 | 9/2009 | Ye et al. |
| 7,739,640 | B2 * | 6/2010 | Abbaspour et al. ............ 716/113 |
| 7,864,301 | B2 | 1/2011 | Socha |
| 7,987,434 | B2 * | 7/2011 | Granik et al. .................... 716/50 |
| 8,082,525 | B2 * | 12/2011 | Liu et al. ......................... 716/52 |
| 2005/0028129 | A1 * | 2/2005 | Hsu et al. ......................... 716/19 |
| 2007/0184357 | A1 | 8/2007 | Abrams et al. |
| 2009/0053621 | A1 | 2/2009 | Socha |
| 2009/0075183 | A1 * | 3/2009 | Cecil ................................ 430/5 |

FOREIGN PATENT DOCUMENTS

| | | |
|---|---|---|
| JP | 2005-181524 | 7/2005 |
| JP | 2007-520892 | 7/2007 |
| JP | 2009-508161 | 2/2009 |
| TW | 200502709 | 1/2005 |

OTHER PUBLICATIONS

Erdmann, Andreas, et al., "Towards Automatic Mask and Source Optmization ofr Optical Lithography", 2004. Optical Microlithography XVII, edited by Bruce W. Smith, Porceedings of SPIE vol. 5377 (SPIE, Bellingham, WA, 2004) 0277-786X/04$15 dol: 10.1117/12.533215, pp. 646-657.*

Xiao, G. et al., Abstract for "Source optimization and mask design to minimize MEEF in low k1 lithography", Proc. SPIE 7028, Photomask and next generation lithography mask technology XV, 70280T (May 16, 2008); doi:10.1117/12.793036., pp. 1-3.*

International Search Report and Written Opinion mailed May 3, 2011 in corresponding International Patent Application No. PCT/US2009/065359.

Linyong Pang et al., Considering MEEF in Inverse Lithography Technology (ILT) and Source Mask Optimization (SMO), Proc. of SPIE, vol. 7122, pp. 71221W-1-71221W-14 (Oct. 17, 2008).

Linyong Pang et al., "Validation of Inverse Lithography Technology (ILT) and its Adaptive SRAF at Advanced Technology Nodes," Proc. of SPIE, vol. 6924, pp. 69240T-1-69240T-12 (Mar. 12, 2008).

Jinyu Zhang et al., "A Highly Efficient Optimization Algorithm for Pixel Manipulation in Inverse Lithography Technique," Computer-Aided Design 2008, IEEE/ACM International Conference on IEEE, pp. 480-487 (Nov. 10, 2008).

Stephen Hsu et al., "An Innovative Source-Mask co-Optimization (SMO) Method for Extending Low k1 Imaging," Proc. of SPIE, vol. 7140, pp. 714010-1-714010-10 (Dec. 4, 2008).

Chris Spence, "Full-Chip Lithography Simulation and Design Analysis—How OPC is changing IC Design," Proc. of SPIE, vol. 5751, pp. 1-14 (2005).

Yu Cao et al., "Optimized Hardware and Software for Fast, Full Chip Simulation," Proc. of SPIE, vol. 5754, pp. 407-414 (2005).

Alan E. Rosenbluth et al., "Optimum mask and source patterns to print a given shape," Journ. of Microlithography, Microfabrication, Microsystems, vol. 1, No. 1, pp. 13-20 (Apr. 2002).

Yuri Granik, "Source optimization for image fidelity and throughput," Journ. of Microlithography, Microfabrication, Microsystems, vol. 3, No. 4, pp. 509-522 (Oct. 2004).

Robert Socha et al., Simultaneous Source Mask Optimization (SMO), Proc. of SPIE, vol. 5853, pp. 180-193 (2005).

International Preliminary Report on Patentability mailed Jun. 3, 2011 in corresponding International Patent Application No. PCT/US2009/065359.

Japanese Office Action mailed Nov. 1, 2012 in corresponding Japanese Patent Application No. 2011-537660.

Chinese Office Action dated Sep. 27, 2012 in corresponding Chinese Patent Application No. 200980145873.9.

Guangming Xiao et al., Source Optimization and Mask Design to Minimize MEEF in Low $k_1$ Lithography, Proc. of SPIE, vol. 7028, pp. 70280T-1-70280T11, May 16, 2008.

* cited by examiner

FAST FREEFORM SOURCE AND MASK CO-OPTIMIZATION METHOD

CROSS-REFERENCE TO RELATED APPLICATIONS

The present application is the U.S. National Stage Application (filed under 35 U.S.C. 371) of prior International Application No. PCT/US2009/065359, filed Nov. 20, 2009, and published on May 27, 2010 as WO 2010/059954, which claims the benefit of U.S. Provisional Patent Application No. 61/116,788, filed Nov 21, 2008, the contents of which are incorporated herein by reference in their entirety.

FIELD OF THE INVENTION

The present invention relates to lithographic apparatuses and processes, and more particularly to tools for optimizing illumination sources and masks for use in lithographic apparatuses and processes.

BACKGROUND OF THE RELATED ART

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed Vat which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example, optical proximity correction (OPC, sometimes also referred to as 'optical and process correction') addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis—How OPC Is Changing IC Design", C. Spence, Proc. SPIE, Vol. 5751, pp 1-14 (2005) provides an overview of current 'model-based' optical proximity correction processes. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

The application of model-based OPC to a target design requires good process models and considerable computational resources, given the many millions of features typically present in a chip design. However, applying OPC is generally not an 'exact science', but an empirical, iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling systems and methods as described, for example in, U.S. patent application Ser. No. 10/815,573 and an article titled "Optimized Hardware and Software For Fast, Full Chip Simulation", by Y. Cao et al., Proc. SPIE, Vol. 5754, 405 (2005).

In addition to performing the foregoing mask adjustments (e.g., OPC) in an effort to optimize the imaging results, the illumination scheme utilized in the imaging process can be also optimized, either jointly with mask optimization or separately, in an effort to improve the overall lithography fidelity. Since the 1990s, many off-axis light sources, such as annular, quadrupole, and dipole, have been introduced, and have provided more freedom for OPC design, thereby improving the imaging results. As is known, off-axis illumination is a proven way to resolve fine structures (i.e., target features) contained in the mask. However, when compared to a traditional illuminator, an off-axis illuminator usually provides less light intensity for the aerial image (AI). Thus, it becomes necessary to attempt to optimize the illuminator to achieve the optimal balance between finer resolution and reduced light intensity.

Numerous prior art illumination optimization approaches are known. For example, in an article by Rosenbluth et al., titled "Optimum Mask and Source Patterns to Print A Given Shape", Journal of Microlithography, Microfabrication, Microsystems 1(1), pp. 13-20, (2002), the source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as γ in Granik's method, which dictates the trade-off between optimizing the source for wafer image fidelity and the smoothness requirement of the source.

For low k1 photolithography, optimization of both source and mask is critical to ensure a viable process window for printing critical patterns. Existing algorithms (e.g. Socha et. al. Proc. SPIE vol. 5853, 2005, p. 180) cannot perform simultaneous optimization of both source and mask. Rather, they generally discretize illumination into independent source points and mask into diffraction orders in the spatial frequency domain, and separately formulate a cost function based on process window metrics such as exposure latitude which could be predicted by optical imaging models from source point intensities and mask diffraction orders. Then standard optimization techniques are used to minimize the objective function.

One problem with these existing algorithms that formulate a cost function is that they require a large number of full forward optical imaging model simulations before convergence on both optimal source and mask is reached. A clip of medium complexity would therefore take weeks or even months to optimize on latest standard PC hardware. However, a product is generally not considered practicable unless the time required is less than about 24 hours.

Relatedly, the delay of EUV lithography and the pressure of ever decreasing design rules have driven semiconductor chipmakers to move deeper into the low $k_1$ lithography era with existing 193 nm ArF lithography. Lithography towards lower $k_1$ puts heavy demands on resolution enhancement techniques (RET), exposure tools, and the need for litho-friendly design. The 1.35 ArF hyper numerical apertures (NA) exposure tool will be the exposure tool for chip manufactures to use in the next two years. To ensure that the design can be printed with workable process window; source-mask optimization (SMO) is becoming an important RET that is required for 2× nm node.

As such, there is a need for a source illumination and mask optimization method and system so as to allow for simultaneous optimization of the source and mask using a cost function without constraints and within a practicable amount of time.

SUMMARY OF THE INVENTION

The present invention relates to lithographic apparatuses and processes, and more particularly to tools for optimizing illumination sources and masks for use in lithographic apparatuses and processes. According to certain aspects, the present invention significantly speeds up the convergence of the optimization by allowing direct computation of gradient of a wide class of cost functions. According to other aspects, the present invention allows for simultaneous optimization of both source and mask, thereby significantly speeding the overall convergence and improving the final result. According to still further aspects, the present invention allows for free-form optimization, without the constraints required by conventional optimization techniques, and discovers the full process window entitlement absent manufacturability constraints. According to yet additional aspects, the present invention employs a method to place sub-resolution assist feature (SRAF) seeds according to free-form optimization results and grows these SRAF seeds simultaneously while performing main feature optical proximity correction (OPC) in a subsequent constrained optimization that takes into account manufacturability constraints from both source and mask sides. According to further aspects, the present invention utilizes a cost function to minimize the worst edge placement errors across process window, and a computationally friendly approximation to such a cost function.

In furtherance of these and other aspects, a method for optimizing a lithographic process according to embodiments of the invention includes receiving descriptions of an illumination source and a mask, the mask comprising a lithography pattern, and until the source and mask are simultaneously optimized for a process window of the lithographic process, selectively repeating the steps of: forming a cost function as a function of both the illumination source and mask, calculating the gradient of the cost function, and reconfiguring the source and mask descriptions depending on the calculated gradient.

In additional furtherance of these and other aspects, a method for optimizing a lithographic process having an illumination source and a mask according to embodiments of the invention includes forming a cost function as a function of descriptions of both the illumination source and mask, wherein the cost function is formulated in terms of worst case edge placement error over a given process window, and calculating a gradient of the cost function.

In yet additional furtherance of these and other aspects, a method for optimizing a lithographic process having an illumination source and a mask according to embodiments of the invention includes a free-form optimization process, placing SRAF seeds in a description of the mask based on a result of the free-form optimization process, and a constrained optimization process, including growing the SRAF seeds while taking into account manufacturability constraints for both the illumination source and the mask.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

- a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.
- a programmable LCD array. An example of such a construction is given in U.S. Pat. No. 5,229,872, which is incorporated herein by reference.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE PREFERRED EMBODIMENTS

Figure 1:
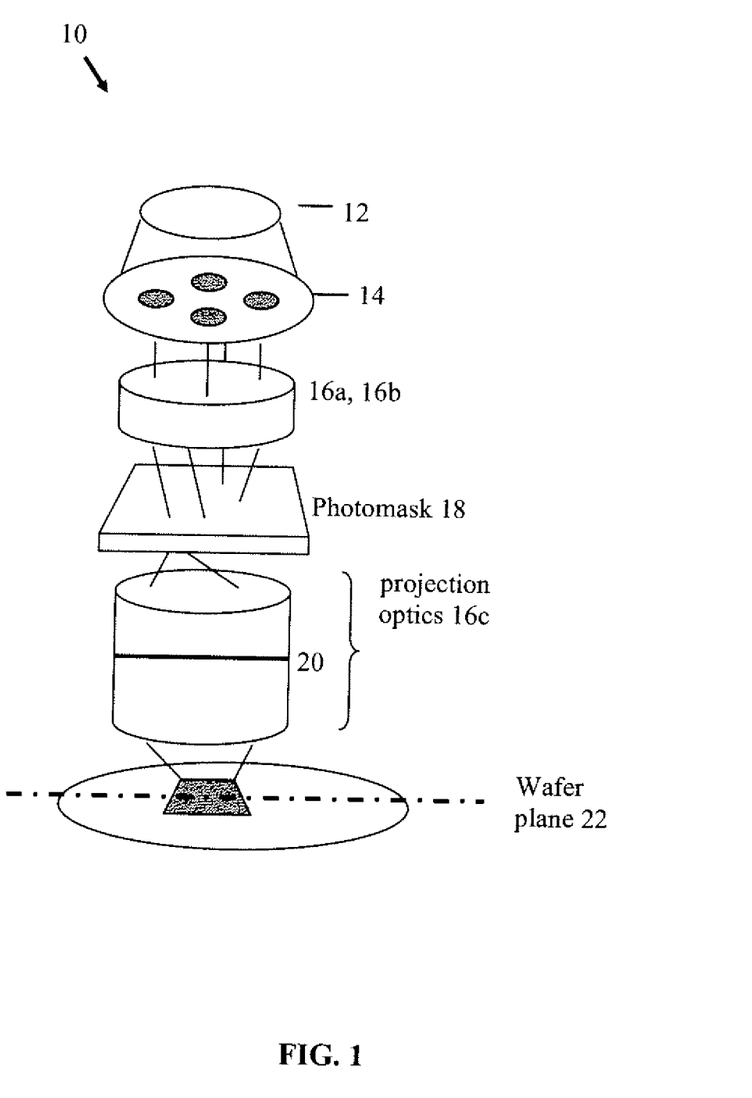
FIG. 1 is an exemplary block diagram illustrating a typical lithographic projection system.

Prior to discussing the present invention, a brief discussion regarding the overall simulation and imaging process is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics NA=sin ($\Theta_{max}$).

Figure 2:
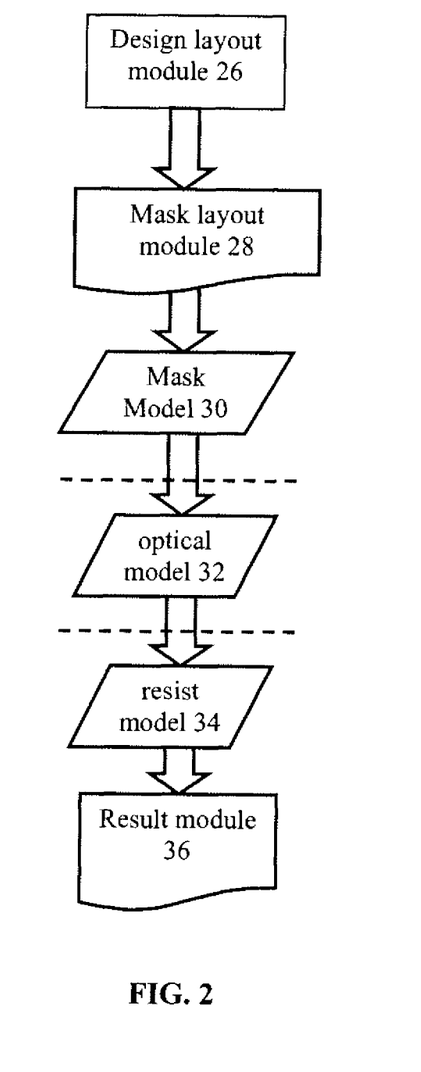
FIG. 2 is an exemplary block diagram illustrating the functional modules of a lithographic simulation model.

In a lithography simulation system, these major system components can be described by separate functional modules, for example, as illustrated in FIG. 2. Referring to FIG. 2, the functional modules include the design layout module 26, which defines the target design; the mask layout module 28, which defines the mask to be utilized in the imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape (e.g. off-axis light sources such as annular, quadrupole, and dipole, etc.). The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask, as described, for example, in U.S. Pat. No. 7,587,704. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS.

In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature. Furthermore, optimization techniques applied to the source of illumination may have different effects on different edges and features. Optimization of illumination sources can include the use of pupils to restrict source illumination to a selected pattern of light. The present invention provides optimization methods that can be applied to both source and mask configurations simultaneously.

Figure 3:
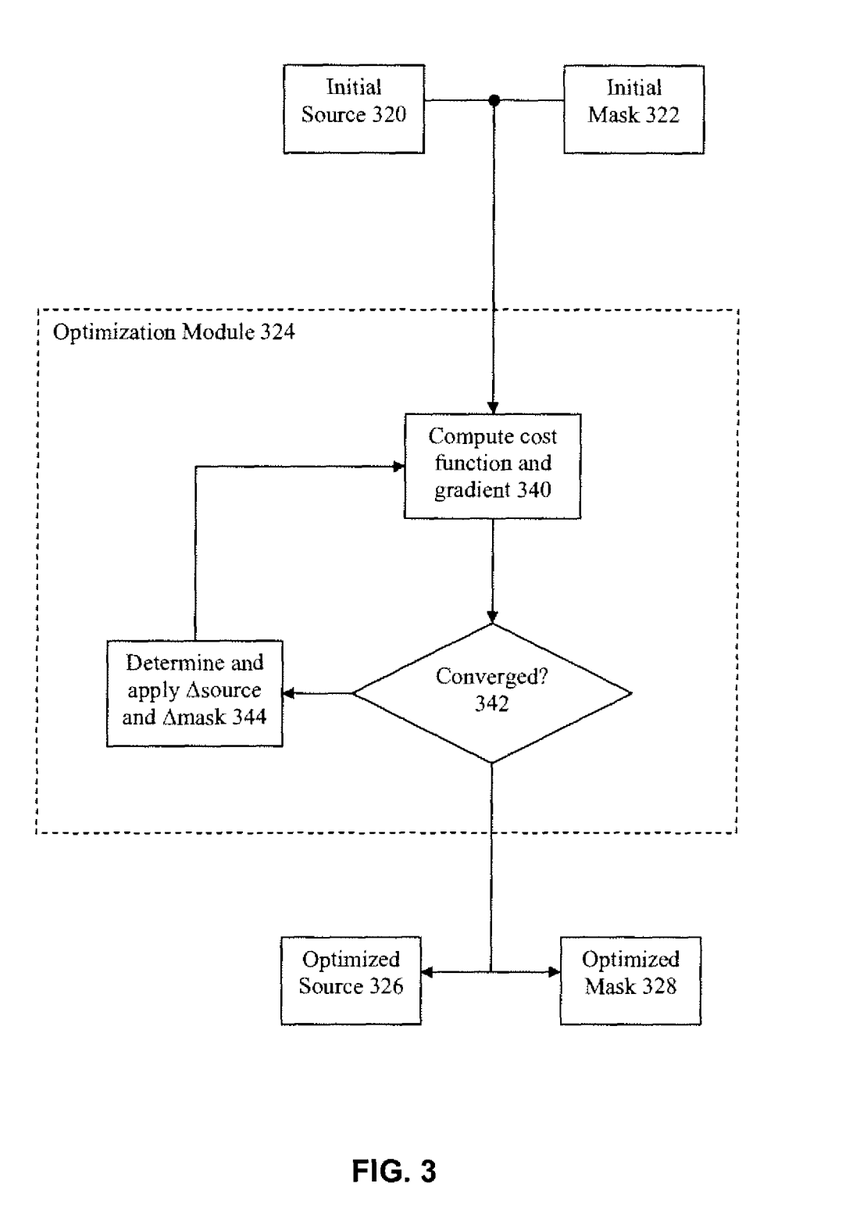
FIG. 3 is a schematic depiction of the general optimization process employed in certain aspects of the invention.

With reference to a high-level block diagram in FIG. 3, certain embodiments of the present invention provide methods for accelerated and simultaneous optimization of mask and source. Initial source 320 and mask 322 configurations (e.g. corresponding to optical model 32 and mask model 30 described above, respectively) are supplied to an optimization module 324. Optimization module 324 comprises an iterative optimizer that calculates a cost function and a gradient for each iteration. At 340, a cost function for the mask and source is evaluated for each iteration. The gradient of the cost function can then be examined at 342 to determine if convergence has been obtained. If the gradient is non-zero, then it may be considered that convergence has not been achieved and changes to source and mask can be calculated and applied at 344 before repeating the steps of computing a cost function and gradient for the new mask and source at 340 and testing for convergence 342. When convergence has been achieved, the final source 326 and mask 326 are considered to be optimized.

Changes to the source and mask in 344 can be calculated and/or performed in a variety of ways, and it is not necessary for the exact sequence shown in FIG. 3 to be followed in all embodiments. For example, optimal results can be obtained by performing an unconstrained (or significantly less constrained) optimization followed by a fully constrained optimization step. The relative more freedom in the unconstrained (or less constrained) optimization step means it is likely to reach an optimal solution in a global sense. The fully constrained optimization would then start from an initial condition derived from this solution.

The unconstrained (or less constrained) optimization can be performed in the space of free-form source and free-form mask. A free-form source is represented as a source intensity map on a sampling grid in the source pupil plane, and pixel values of the map are allowed to vary freely. Similarly, a free-form mask is the mask transmission map on a sampling grid with each pixel value free to vary. Free-form optimization permits faster calculation of the gradient of the cost function and certain algorithms can be selected to accelerate the achievement of an optimal solution.

The initial condition of the fully constrained optimization can be constructed from the free-form result via a seeding process. The free-form mask result would serve as a guide as to potential locations to insert sub-resolution assist features (SRAF). Small SRAF seeds are then placed at these locations and are allowed to grow or shrink or move during the optimization. The main features of the mask design are also co-optimized along with the SRAF seeds to achieve the best solution. Similarly, the free-form source result could also be used to select candidates for the final illumination solutions, for example, ones based on diffractive optical elements (DOE). These source solution candidates could also be simultaneously optimized with main and SRAF mask features.

Referring back to step 340 in FIG. 3, certain aspects of the invention include significantly speeding up the convergence of the optimization by allowing direct computation of the gradient of the cost function. The methods include the use of linearized functions selected to optimize the printed wafer contour throughout the process window. The cost function is typically based on a pure optical model because optics in photolithography systems tend to determine a majority of the process constraints. In one example, the cost function may be selected to reduce the worst edge placement error of a design layout throughout the process window. Mathematically, the cost function F may be written as:

$$F = \max_{pw}\max_{e} EPE(pw, e)$$

where pw is a list of process window conditions and variable e runs over a set of evaluation points placed along the target design layout.

This cost function could be transformed into a more computationally efficient form by employing the following approximations.

First, EPE is approximated by a linearized approximation, $$EPE(pw, e) \approx \frac{[I_{pw}(e) - I_{th}]}{\|\nabla I_{pw}\|},$$

where $I_{pw}(e)$ denotes the aerial image intensity at process window condition pw, and $I_{th}$ the threshold for the aerial image contour. The denominator, $\|\nabla I_{pw}\|$, represents the slope of aerial image.

Next, the max operator is approximated by an $L_p$ norm, $$F^p \approx \sum_{pw}\sum_{e} EPE^p(pw, e),$$

with p a positive integer. The bigger the value of p, the better this approximation is.

Putting everything together, we have this new cost function, $$F = \sum_{pw}\sum_{x} w(pw, x)\frac{[I_{pw}(x) - I_{th}]^p}{\|\nabla I_{pw}\|^p}, \; p \in N.$$

As can be seen, a weighting factor w(pw,e) is also preferably introduced to provide extra flexibility to control the goal of the optimization, which could be determined from considerations like evaluation point location (e.g. line, line end, jog) or relevant feature size (e.g. line width, space), or process window position.

Those skilled in the art will recognize many ways how the mask transmissions M(x) and source intensities S(s) can be derived from the received source and mask descriptions (e.g. pixel-based maps corresponding to mask model 30 and optical model 32, respectively), and so details thereof will be omitted here for the sake of clarity of the invention. The present inventors recognize that aerial intensity I can be regarded as a function of mask transmissions M(x) and source intensities S(s), and therefore so can the cost function F. The cost function may be expanded using a Taylor series and, in certain embodiments, the floor of the gradient may be discovered using first order terms. More particularly, F may be expressed as:

$$F = F[I(M(x), S(s))] = F[M(x), S(s)]$$

This cost function may be minimized using any of a variety of known algorithms when the gradient or derivatives of F are computed with respect to M and S:

$$F \approx F[M_0, S_0] + \sum_{x}\frac{\delta F}{\delta M(x)}(M(x) - M_0(x)) + \sum_{s}\frac{\delta F}{\delta S(s)}(S(s) - S_0(s))$$

The derivatives of aerial image intensity I with respect to M and S, and by the chain rule, derivatives of F can be efficiently computed and the time to compute all derivatives is on the same order of magnitude as a single aerial image computation. The aerial image is the summation of contribution from each source point, and its variation with respect to the source map is the single contribution:

$$I[M(x), S(s)] = \int ds S(s)I_s[M(x)]$$

$$\frac{\delta I[M(x), S(s)]}{\delta S(s')} = I_s[M(x)]\delta(s - s')$$

The aerial image can also be expressed in Hopkins formulation as a sum of coherence systems:

$$I[M(x), S(s)] = \int dx' dx'' M(x') J_s(x - x', x - x'') M^*(x'')$$

$$= \sum_{k}\lambda_k \left\|\int dx' V_k(x - x')M(x')\right\|^2$$

$$\equiv \sum_{k}\lambda_k \|V_k \otimes M\|^2$$

$$\frac{\delta I[M(x), S(s)]}{\delta M(x')} = \sum_{k}\lambda_k V_k(x - x')\int dx'' V_k^*(x - x'')M^*(x'') + c.c.$$

Where "c.c." represents the complex conjugate.

Having determined the aerial image variations, the variations of the cost function itself as a function of the aerial image can be computed as follows:

$$F = F[I(M(x), S(s))]$$

$$\frac{\delta F}{\delta M(x)} = \int dx'\frac{\delta F}{\delta I(x')}\frac{\delta I(x', s)}{\delta M(x)}$$

$$= \sum_{k}\lambda_k \int dx'\frac{\delta F}{\delta I(x')}V_k(x' - x)$$

$$\int dx'' V_k^*(x' - x'')M^*(x'') + c.c$$

$$= \sum_{k}\lambda_k \left(\hat{V}_k \otimes \left(\frac{\delta F}{\delta I}(V_k \otimes M)^*\right)\right) + c.c.,$$

$$\hat{V}_k(x) \equiv V_k(-x)$$

$$\frac{\delta F}{\delta S(s)} = \int ds'\int dx'\frac{\delta F}{\delta I(x')}\frac{\delta I(x', s')}{\delta S(s)} = \int dx'\frac{\delta F}{\delta I(x')}I_s(x', s)$$

According to aspects of the invention that can be ascertained from the above, the variation with respect to mask image can be computed as a series of convolutions, thereby providing means for significantly decreasing computation time. The variation of the cost function with respect to the aerial image itself may be computed and the form of the cost function may be written:

$$F = F[I(x)] = \int dx\, w(x) f(I(x), \nabla I(x)).$$

In this case, the variation would be:

$$\frac{\delta F}{\delta I(x)} = w(x)\frac{\partial f}{\partial I} - \nabla \cdot \left(w(x)\frac{\partial f}{\partial \nabla I}\right)$$

Thus, variations of the cost function with respect to both source and mask can be simultaneously obtained. In the freeform source and mask optimization these variations become the gradient of the cost function. Thereafter, any suitable gradient-based optimization technique can be applied to find a minimum of the cost function.

The descriptions above provide an example embodiment where the cost function is based on EPE. Examples of other cost functions include (1) the EPE least square function, (2) the EPE least p-norm function where p is even and greater than 2, (3) the inverse NILS p-norm function, (4) the contour integral of image slope with M as the design target, (5) the edge image value least square, (6) the edge image p-norm (p is even and >2) and (7) the ILS p-norm with F to be maximized. The seven corresponding cost function equations are listed below:

$$F = \sum_{pw}\sum_{x} w(pw, x)\frac{[I_{pw}(x) - I_{th}]^2}{\|\nabla I_{pw}\|^2} \quad (1)$$

$$F = \sum_{pw}\sum_{x} w(pw, x)\frac{[I_{pw}(x) - I_{th}]^p}{\|\nabla I_{pw}\|^p} \quad (2)$$

$$F = \sum_{pw}\sum_{x} w(pw, x)\frac{[I_{pw}(x)]^p}{\|CD_x \nabla I_{pw}\|^p} \quad (3)$$

$$F = -\sum_{pw}\oint_{\partial M} dl\, w(pw, x)(\hat{n} \cdot \nabla I_{pw}) \quad (4)$$

$$= -\sum_{pw}\int_{M}\int dS\, \nabla \cdot (w(pw, x)\nabla I_{pw})$$

$$F = \sum_{pw}\sum_{x} w(pw, x)[I_{pw}(x) - I_{th}]^2 \quad (5)$$

$$F = \sum_{pw}\sum_{x} w(pw, x)[I_{pw}(x) - I_{th}]^p \quad (6)$$

$$F = \sum_{pw}\sum_{x} w(pw, x)\frac{\|\nabla I_{pw}\|^p}{CD_x} \quad (7)$$

One skilled in the art would fully understand how to determine the optimized gradient for these and other cost functions based after being taught by the above descriptions. For example, some standard optimization techniques utilize gradient information such as steepest descent, conjugation gradient or quasi-Newton methods.

The gradient calculation formulae described above can be implemented in various computing platforms. Additionally or alternatively, specially adapted hardware acceleration platforms can be used to further improve the optimization speed. For example, platforms can that include specialized digital signal processors ("DSPs") can be employed to process cost functions and calculate gradients. However, it will be appreciated that calculations may be performed on other computing platforms that can comprise parallel processors, mathematical coprocessors and DSP based coprocessors.

To provide synergy between certain types of scanners and SMO solutions to meet advanced low $k_1$ imaging requirements, and armed with the optimization algorithms described above, the present inventors have developed a SMO flow that can utilize fully flexible illuminators or different types of application specific/custom DOEs, rather than standard or pre-selected illumination designs.

Figure 4:
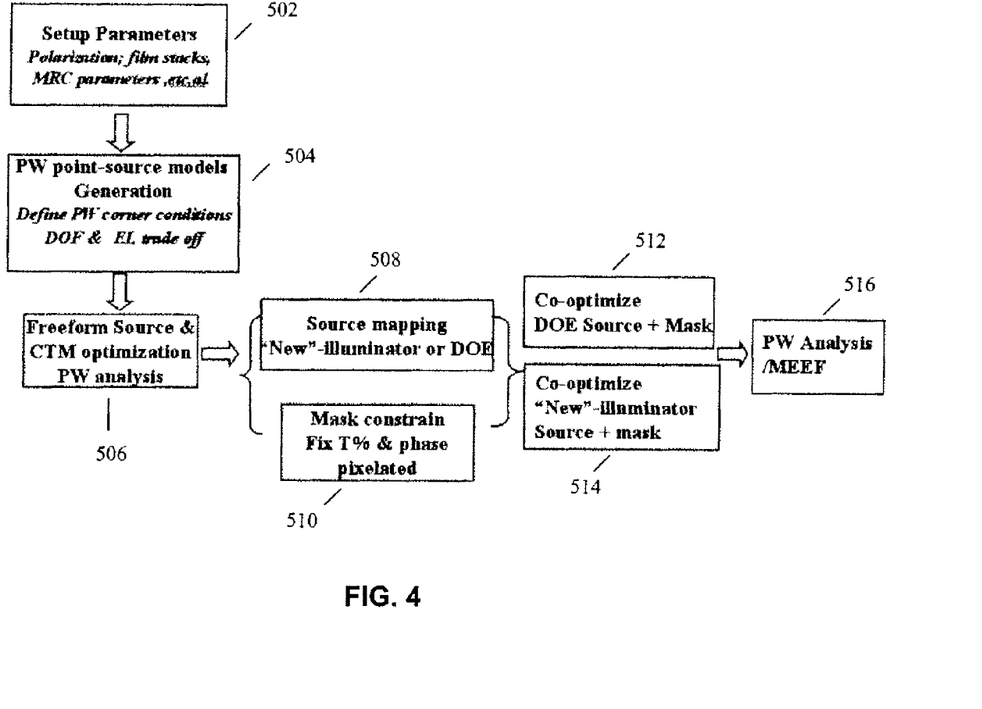
FIG. 4 is a chart illustrating a source and continuous transmission mask co-optimization flow (CTM flow) according to additional embodiments of the invention.

In this regard, FIG. 4 illustrates a source and continuous transmission mask co-optimization flow (CTM flow) according to additional embodiments of the invention. As shown in FIG. 4, the first step of the CTM flow is to set up all the input parameters for the optimization including: Model, DOE type, polarization, mask manufacture rule check (MRC) and process information etc. (502). For example, in the set up, a user specifies the type of source constraints to be applied, either custom DOE or fully-flexible illuminator. This will determine later how the unconstrained freeform source will be converted and co-optimized. These setup parameters are used through out the entire flow. Then, models will be created at user-specified PW corner conditions as shown in FIG. 4 (504). Users can specify the DOF versus EL trade off in this step, for example.

Figure 5:
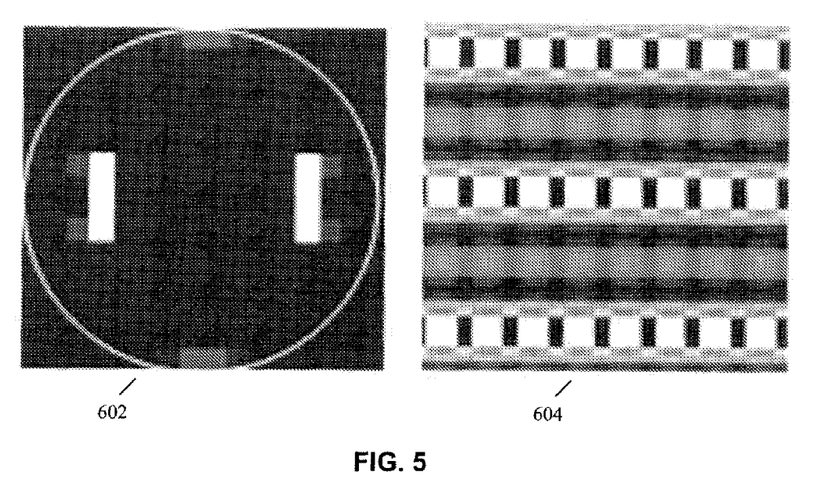
FIG. 5 illustrates a resultant source and mask for an example application of a design for a DRAM.

With all the setup parameters, step 506 starts the co-optimization with unconstrained freeform source and continuous transmission mask, using for example the optimization process of optimization module 324, including the cost function and gradient calculations, freeform source and mask optimizations and assist feature optimizations described above. The only constraint in this stage is the upper and lower bound of mask and source transmission which has physical limitations. Without constraints, optimization in this stage will search for solutions in the largest possible solution space, and give the best possible process window (PW) and MEF. The resultant source 602 and mask 604 for an example application of a design for a DRAM is shown in FIG. 5, respectively. However, neither the freeform source nor continuous transmission mask are manufacturable. Therefore, after freeform source and continuous transmission mask co-optimization, for practical purposes, on the source side, it needs to be converted into a manufacturable source (508), such as a DOE 704 shown in FIG. 6 or a "New" (e.g. fully flexible) illuminator 702 shown in FIG. 6. On the mask side, the mask needs to be constrained to a fixed transmission value (510). Then the selected source-mask combination is co-optimized using the scanner illuminator and mask manufacture rule check (MRC) constraints. The "New" illuminator closely resembles the freeform source (resulting from 514), and is expected to give minimal impact on the PW (as analyzed in 516) compared to a parametric DOE source (resulting from 512).

Figure 6:
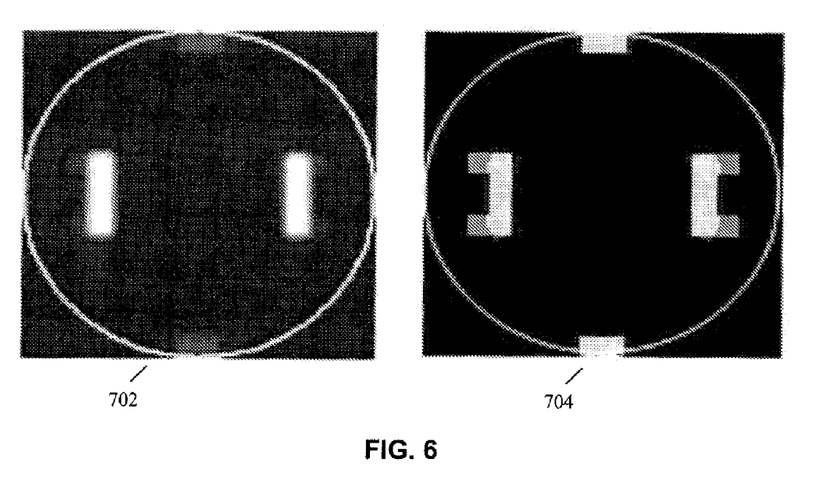
FIG. 6 illustrates a converted "New" illuminator and DOE source according to an example application of the invention.

For an example application for a DRAM design, FIG. 6 shows the converted "New" illuminator 702 and DOE source 704, respectively. From the optimized continuous transmission mask gray tone image, AF seeds are extracted and are optimized during the next stage. In the final stage, the constrained source along with the main and assist features on the mask will be optimized with the same cost function as in the initial co-optimization result (512 and 514). Co-optimization is crucial in this step because both the source and mask manufacturability constraints can significantly modify the original source topology, and performs a mask-only optimization which does not guarantee the optimum result. FIGS.

Figure 7A:
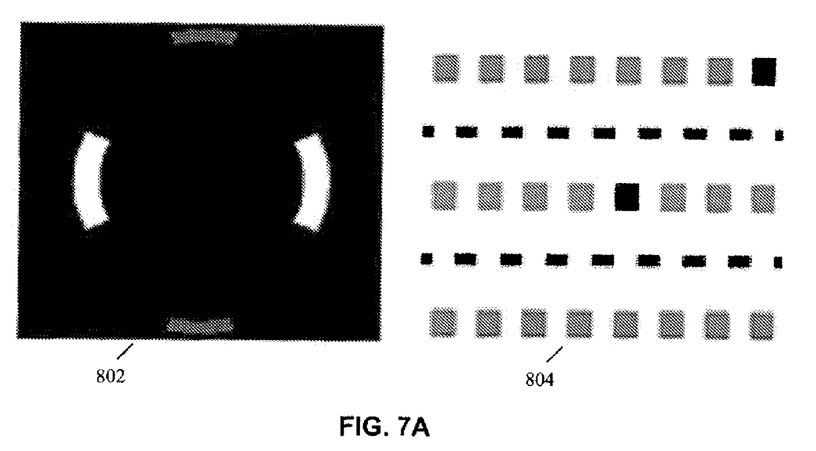
FIGS. 7A and 7B illustrate example masks that result with a DOE source and "New" illuminator according to applications of the invention.
Figure 7B:
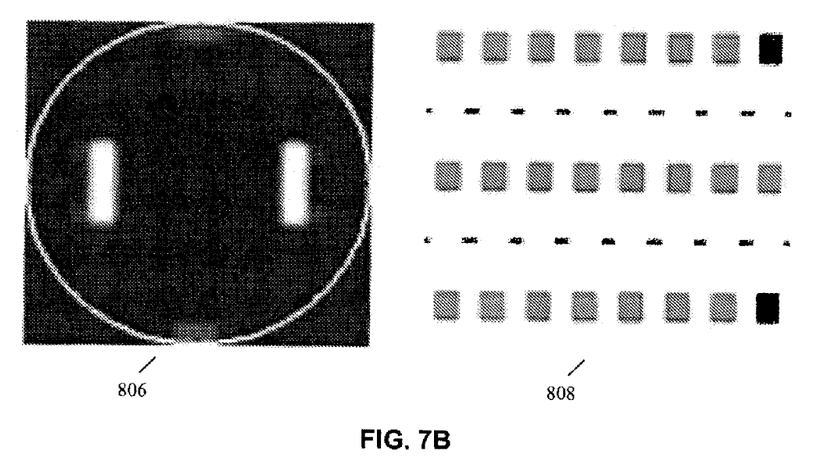

7A and 7B show the masks 804 and 808 that result with the DOE source 802 and "New" illuminator 806, respectively.

Figure 8:
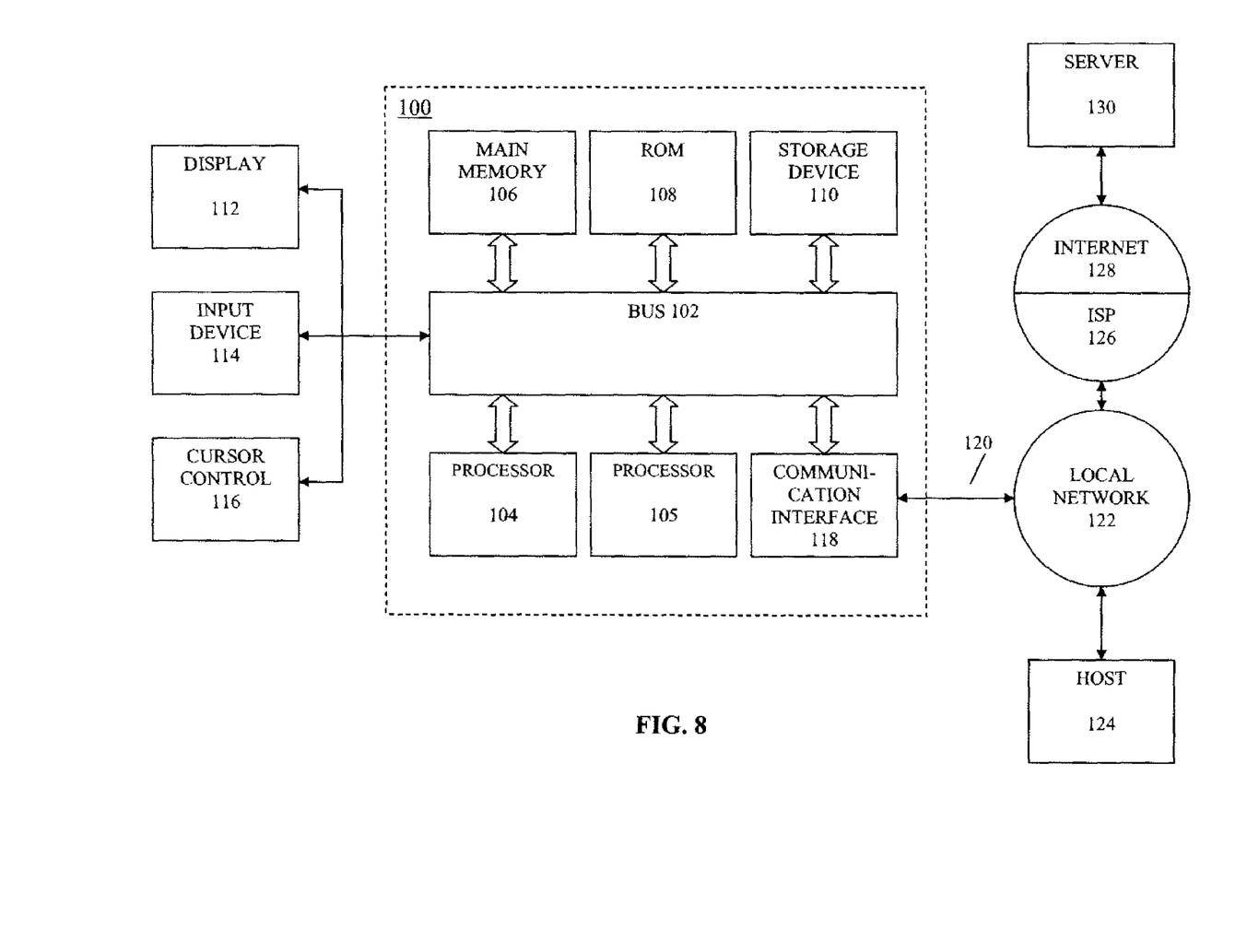
FIG. 8 is a block diagram that illustrates a computer system which can assist in the implementation of the simulation method of the present invention.

FIG. 8 is a block diagram that illustrates a computer system 100 which can assist in implementing the optimization methods and flows disclosed herein. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 9:
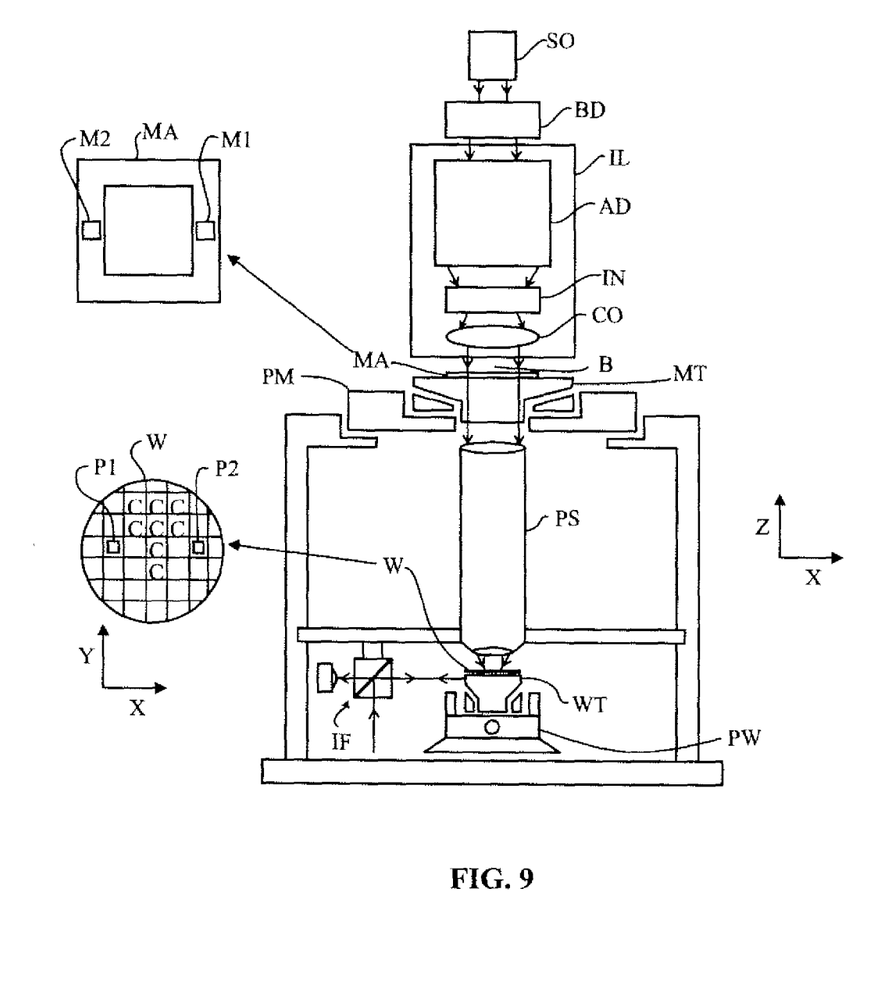
FIG. 9 schematically depicts a lithographic projection apparatus suitable for use with the method of the present invention.

FIG. 9 schematically depicts an exemplary lithographic projection apparatus whose illumination source could be optimized utilizing the process of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 9 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 9. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made to the invention as described without departing from the scope of the claims set out below.

What is claimed is:

1. A computer-implemented method for achieving a lithographic process with a desired process window, the method comprising:

receiving descriptions of an illumination source and a mask, the mask comprising a target pattern to be imaged by the lithographic process; and until the source and mask are simultaneously optimized for the desired process window of the lithographic process, selectively repeating the steps of:

forming a cost function as a function of both the illumination source and the mask;

calculating a gradient of the cost function, and reconfiguring the source and mask descriptions depending on the calculated gradient, wherein one or more of the above steps are performed by the computer.

2. The method of claim 1, wherein the source and mask are optimized when the calculated gradient has a value of zero.

3. The method of claim 2, further comprising characterizing the source as independent source points.

4. The method of claim 2, further comprising characterizing the mask as diffraction elements in a spatial frequency domain.

5. The method of claim 4, wherein reconfiguring the mask description includes:
    using optical proximity correction;
    placing sub-resolution assist features; and
    recharacterizing the reconfigured mask description.

6. The method of claim 1, wherein the cost function is formulated in terms of worst case edge placement error over a given process window.

7. The method of claim 6, wherein the cost function F is expressed as:

$$F = \sum_{pw} \sum_{x} w(pw, x) \frac{[I_{pw}(x) - I_{th}]^p}{\|\nabla I_{pw}\|^p}, \; p \in N,$$

wherein $I_{pw}(e)$ denotes aerial image intensity at process window condition pw, and wherein $I_{th}$ denotes a threshold for an aerial image contour, and wherein the denominator, and wherein $\|\nabla I_{pw}\|$ represents a slope of an aerial image, and wherein w(pw,x) is a weighting function, and wherein p is a positive integer corresponding to an $L_p$ norm.

8. A computer-implemented method for achieving a lithographic process with a desired process window, the lithographic process using an illumination source and a mask, the method comprising:
    forming a cost function as a function of descriptions of both the illumination source and the mask, wherein the cost function is formulated in terms of worst case edge placement error over a given process window conditions; and
    calculating a gradient of the cost function to simultaneously optimize both the illumination source and the mask for the desired process window,
    wherein one or more of the above steps are performed by the computer.

9. A method according to claim 8, further comprising, before the calculating step, forming a computationally efficient approximation of the cost function.

10. The method of claim 9, wherein the computationally efficient approximation of the cost function comprises a linearized approximation based on aerial image intensity at a given process window condition.

11. The method of claim 8, wherein the illumination source arid the mask are optimized when the calculated gradient of the cost function has a value of zero.

12. The method of claim 11, further comprising characterizing the illumination source as independent source points.

13. The method of claim 11, further comprising characterizing the mask as diffraction elements in a spatial frequency domain.

14. A computer program product comprising a non-transitory computer readable medium having instructions recorded thereon, the instructions, when executed by a computer, implements a method for achieving a lithographic process with a desired process window by performing the steps of:
    receiving descriptions of an illumination source and a mask, the mask comprising a lithography pattern; and
    until the source and mask are simultaneously optimized for the desired process window of the lithographic process, selectively repeating the steps of:
        forming a cost function as a function of both the illumination source and the mask;
        calculating a gradient of the cost function, and
        reconfiguring the source and mask descriptions depending on the calculated gradient.

15. The computer program product of claim 14, wherein the computer program product runs on a computing platform, the computing platform comprising specialized digital signal processors for processing cost functions and for calculating gradients.

* * * * *